(12) United States Patent
Lee et al.

(10) Patent No.: US 12,004,296 B2
(45) Date of Patent: Jun. 4, 2024

(54) PRINTED CIRCUIT BOARD

(71) Applicant: SAMSUNG ELECTRO-MECHANICS CO., LTD., Suwon-si (KR)

(72) Inventors: Jin Uk Lee, Suwon-si (KR); Chi Won Hwang, Suwon-si (KR); Eun Sun Kim, Suwon-si (KR); Yong Wan Ji, Suwon-si (KR); Young Hun You, Suwon-si (KR)

(73) Assignee: SAMSUNG ELECTRO-MECHANICS CO., LTD., Suwon-si (KR)

( * ) Notice: Subject to any disclaimer, the term of this patent is extended or adjusted under 35 U.S.C. 154(b) by 32 days.

(21) Appl. No.: 17/712,327

(22) Filed: Apr. 4, 2022

(65) Prior Publication Data

US 2023/0199955 A1    Jun. 22, 2023

(30) Foreign Application Priority Data

Dec. 22, 2021   (KR) .......................... 10-2021-0184735

(51) Int. Cl.
*H05K 1/11*  (2006.01)
*H05K 1/02*  (2006.01)

(52) U.S. Cl.
CPC ........... *H05K 1/115* (2013.01); *H05K 1/0218* (2013.01); *H05K 1/0265* (2013.01); *H05K 1/0298* (2013.01); *H05K 2201/0191* (2013.01); *H05K 2201/096* (2013.01)

(58) Field of Classification Search
CPC ............. H05K 1/115; H05K 2201/096; H05K 1/0218; H05K 2201/0191; H05K 3/4688; H05K 1/0265
See application file for complete search history.

(56) References Cited

U.S. PATENT DOCUMENTS

| 7,679,005 | B2* | 3/2010 | Chan | G06K 19/005 |
|---|---|---|---|---|
| | | | | 174/262 |
| 2016/0007460 | A1* | 1/2016 | Shimizu | H05K 1/112 |
| | | | | 361/783 |
| 2016/0172287 | A1* | 6/2016 | Arisaka | H05K 1/181 |
| | | | | 257/774 |
| 2018/0146543 | A1* | 5/2018 | Chen | H05K 1/0224 |
| 2019/0373729 | A1 | 12/2019 | Park et al. | |

FOREIGN PATENT DOCUMENTS

| JP | 2004-071578 A | 3/2004 |
|---|---|---|
| KR | 10-2019-0135811 A | 12/2019 |

* cited by examiner

*Primary Examiner* — Ishwarbhai B Patel
(74) *Attorney, Agent, or Firm* — Morgan, Lewis & Bockius LLP

(57) ABSTRACT

A printed circuit board includes: an insulating member; a first wiring layer disposed in the insulating member, and including first and second pattern layers spaced apart from each other based on a thickness direction of the printed circuit board; and a second wiring layer disposed in the insulating member, and spaced apart from the first pattern layer over the first pattern layer based on the thickness direction. Based on the thickness direction, an insulation distance between the first pattern layer and the second pattern layer is smaller than an insulation distance between the first pattern layer and the second wiring layer, and each of the first and second pattern layers is thinner than the second wiring layer.

15 Claims, 5 Drawing Sheets

PRINTED CIRCUIT BOARD

CROSS-REFERENCE TO RELATED APPLICATION(S)

This application claims benefit of priority to Korean Patent Application No. 10-2021-0184735 filed on Dec. 22, 2021 in the Korean Intellectual Property Office, the disclosure of which is incorporated herein by reference in its entirety.

TECHNICAL FIELD

The present disclosure relates to a printed circuit board.

BACKGROUND

The current substrate technology has a limitation in realizing a fine circuit. For example, while an exposure machine capable of exposing at least 250 mm×250 mm is required to manufacture a printed circuit board, an increase in resolution corresponding to L/S=3/3 or less may decrease an exposure area, resulting in a decrease in productivity. In addition, while a size of a high value-added substrate to which a fine circuit is applied increases to 100 mm×100 mm or more, an exposure machine for L/S=2/2 or less is not capable of properly handling even one unit substrate because it has a work size of less than 100 mm×100 mm. Therefore, there has been a need for a technology capable of replacing the current substrate technology.

SUMMARY

An aspect of the present disclosure may provide a printed circuit board capable of realizing circuit density equivalent to that of a fine circuit.

Another aspect of the present disclosure may provide a printed circuit board capable of large-area exposure.

One of several solutions suggested through the present disclosure is to increase a pitch by dividing a layer, thereby increasing circuit density while securing processability.

According to an aspect of the present disclosure, a printed circuit board may include: an insulating member; a first wiring layer disposed in the insulating member, and including first and second pattern layers spaced apart from each other based on a thickness direction of the printed circuit board; and a second wiring layer disposed in the insulating member, and spaced apart from the first pattern layer over the first pattern layer based on the thickness direction. Based on the thickness direction, an insulation distance between the first pattern layer and the second pattern layer may be smaller than an insulation distance between the first pattern layer and the second wiring layer, and each of the first and second pattern layers may be thinner than the second wiring layer.

According to another aspect of the present disclosure, a printed circuit board may include: a first insulating layer; a first wiring layer disposed on the first insulating layer; a second insulating layer disposed on the first insulating layer and covering the first wiring layer; a second wiring layer disposed on the second insulating layer; a third insulating layer disposed on the second insulating layer and covering the second wiring layer; and a third wiring layer disposed on the third insulating layer. Each of the second and third wiring layers may be thinner than the first wiring layer, and based on a thickness direction of the printed circuit board, an insulation distance between the second and third wiring layers may be smaller than an insulation distance between the first and second wiring layers.

According to another aspect of the present disclosure, a printed circuit board may include: an insulating member; an upper wiring layer and a lower wiring layer disposed in the insulating member; and a first pattern layer and a second pattern layer spaced apart from each other based on a thickness direction of the printed circuit board, the first pattern layer disposed between the upper wiring layer and the second pattern layer, and the second pattern layer disposed between the lower wiring layer and the first pattern layer. Based on the thickness direction, an insulation distance between the first pattern layer and the second pattern layer may be smaller than an insulation distance between the first pattern layer and the upper wiring layer and an insulation distance between the second pattern layer and the lower wiring layer. In a plan view, patterns of the first pattern layer and patterns of the second pattern layer are alternately disposed.

BRIEF DESCRIPTION OF DRAWINGS

The above and other aspects, features, and advantages of the present disclosure will be more clearly understood from the following detailed description taken in conjunction with the accompanying drawings, in which.

DETAILED DESCRIPTION

Hereinafter, exemplary embodiments of the present disclosure will now be described in detail with reference to the accompanying drawings.

Electronic Device

Figure 1:
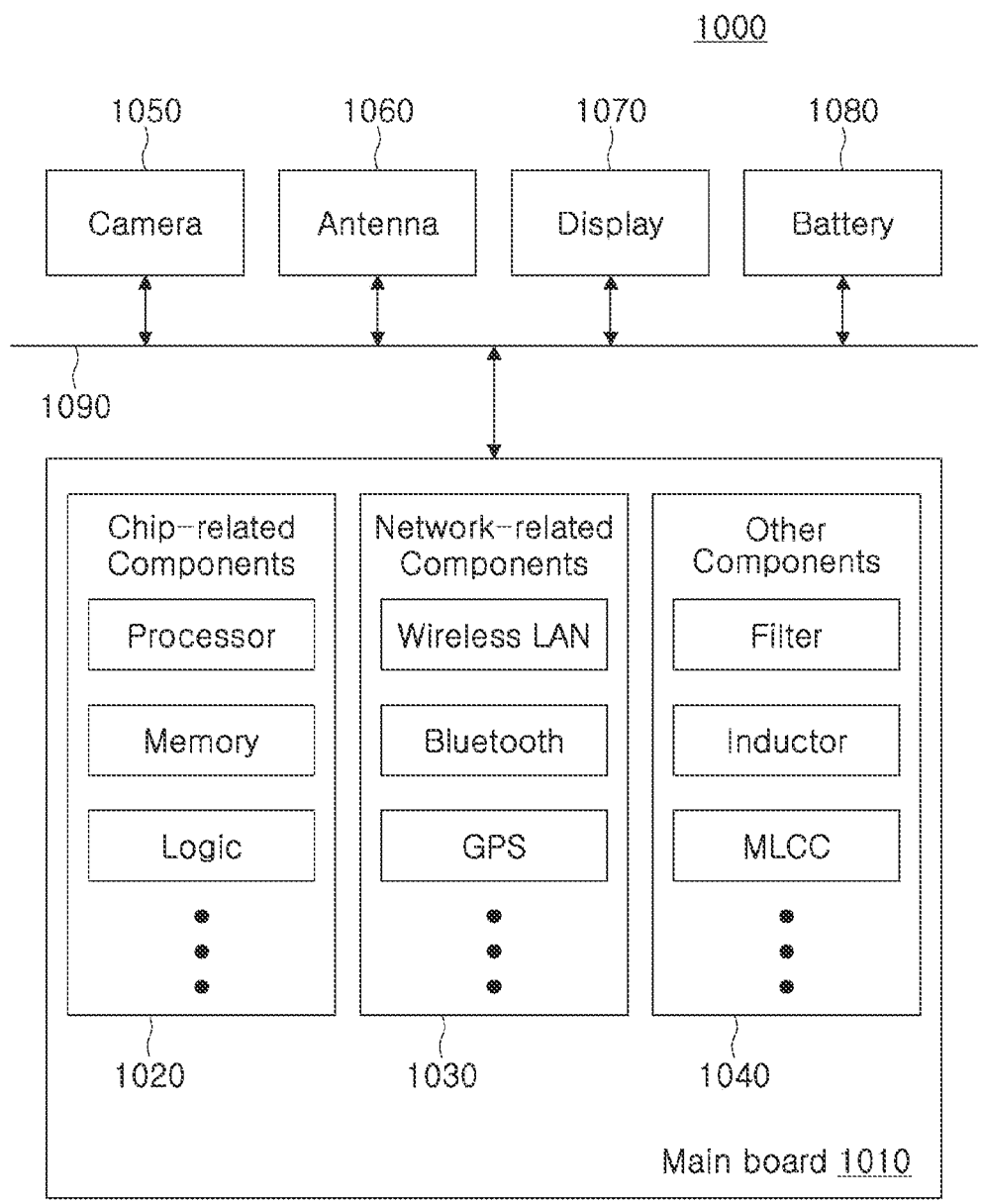
FIG. 1 is a schematic block diagram illustrating an example of an electronic device system.

FIG. 1 is a schematic block diagram illustrating an example of an electronic device system.

Referring to FIG. 1, an electronic device 1000 may accommodate a mainboard 1010 therein. The mainboard 1010 may include chip-related components 1020, network-related components 1030, and other components 1040, which are physically and/or electrically connected thereto. These components may be connected to other electronic components to be described below to form various signal lines 1090.

The chip-related components 1020 may include a memory chip such as a volatile memory (e.g., a dynamic random access memory (DRAM)), a non-volatile memory (e.g., a read only memory (ROM)), or a flash memory; an application processor chip such as a central processor (e.g., a central processing unit (CPU)), a graphics processor (e.g., a graphics processing unit (GPU)), a digital signal processor, a cryptographic processor, a microprocessor, or a microcontroller; and a logic chip such as an analog-to-digital converter or an application-specific integrated circuit (ASIC).

The chip-related components 1020 are not limited thereto, but may also include other types of chip-related electronic components. In addition, the chip-related components 1020 may be combined with each other. The chip-related components 1020 may be in the form of a package including the chips or electronic components described above.

The network-related components 1030 may include protocols such as wireless fidelity (Wi-Fi) (Institute of Electrical and Electronics Engineers (IEEE) 802.11 family or the like), worldwide interoperability for microwave access (WiMAX) (IEEE 802.16 family or the like), IEEE 802.20, long term evolution (LTE), evolution data only (Ev-DO), high speed packet access+ (HSPA+), high speed downlink packet access+ (HSDPA+), high speed uplink packet access+ (HSUPA+), global system for mobile communications (GSM), enhanced data GSM environment (EDGE), global positioning system (GPS), general packet radio service (GPRS), code division multiple access (CDMA), time division multiple access (TDMA), digital enhanced cordless telecommunications (DECT), Bluetooth, 3G, 4G, and 5G protocols, and any other wireless and wired protocols designated after the abovementioned protocols. However, the network-related components 1030 are not limited thereto, but may also include a variety of other wireless or wired standards or protocols. In addition, the network-related components 1030 may be combined with each other, together with the chip-related components 1020.

The other components 1040 may include a high frequency inductor, a ferrite inductor, a power inductor, ferrite beads, a low temperature co-fired ceramic (LTCC), an electromagnetic interference (EMI) filter, a multilayer ceramic capacitor (MLCC), or the like. However, the other components 1040 are not limited thereto, but also include passive elements in chip component type used for various other purposes, and the like. In addition, the other components 1040 may be combined with each other, together with the chip-related components 1020 and/or the network-related components 1030.

Depending on the type of electronic device 1000, the electronic device 1000 may include other electronic components that may or may not be physically and/or electrically connected to the mainboard 1010. Examples of the other electronic components may include a camera 1050, an antenna 1060, a display 1070, a battery 1080, and the like. The other electronic components are not limited thereto, but may be an audio codec, a video codec, a power amplifier, a compass, an accelerometer, a gyroscope, a speaker, a mass storage unit (e.g., a hard disk drive), a compact disk (CD), a digital versatile disk (DVD), and the like. The other electronic components may also include other electronic components and the like used for various purposes depending on the type of electronic device 1000.

The electronic device 1000 may be a smartphone, a personal digital assistant (PDA), a digital video camera, a digital still camera, a network system, a computer, a monitor, a tablet PC, a laptop PC, a netbook PC, a television, a video game machine, a smartwatch, an automotive component, or the like. However, the electronic device 1000 is not limited thereto, but may be any other electronic device processing data.

Figure 2:
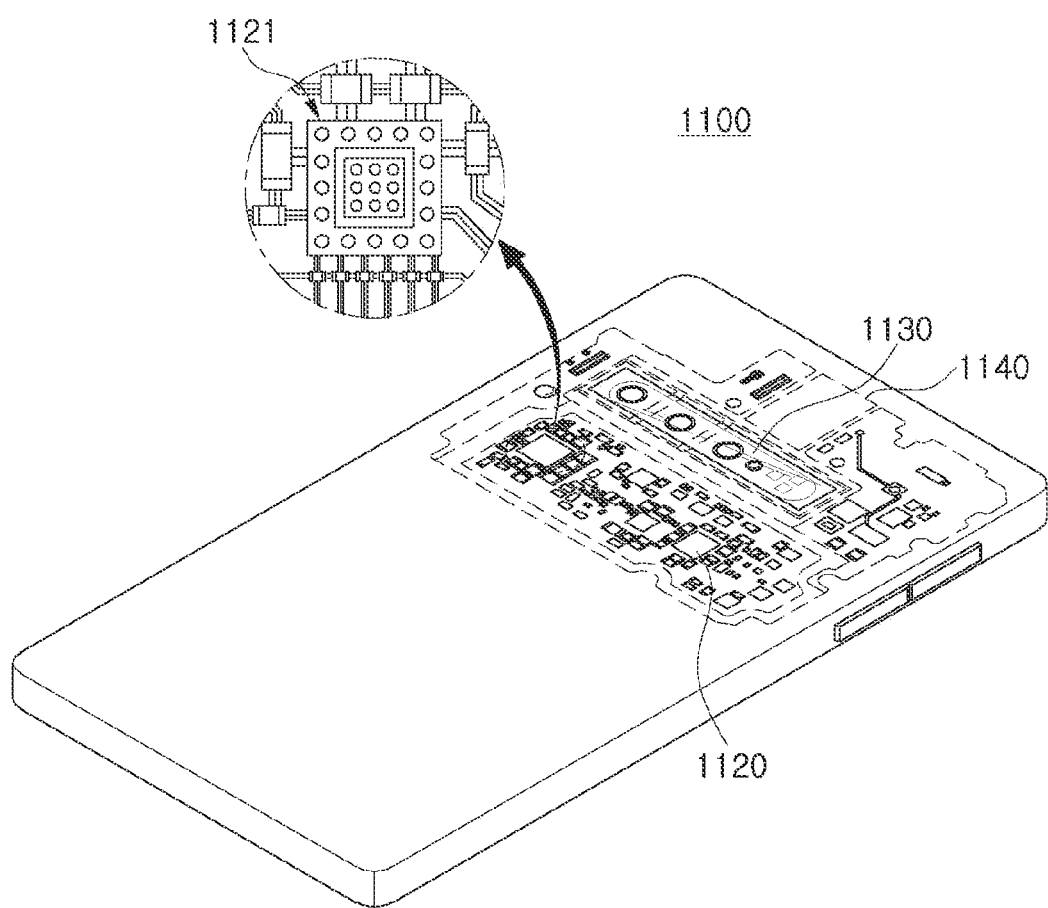
FIG. 2 is a schematic perspective view illustrating an example of an electronic device.

FIG. 2 is a schematic perspective view illustrating an example of an electronic device.

Referring to FIG. 2, the electronic device may be, for example, a smartphone 1100. A motherboard 1110 may be accommodated in the smartphone 1100, and various components 1120 may be physically and/or electrically connected to the motherboard 1110. Also, other components that may or may not be physically and/or electrically connected to the motherboard 1110, such as a camera module 1130 and/or a speaker 1140, may be accommodated in the smartphone 1100. Some of the components 1120 may be the above-described chip-related components, e.g., a component package 1121, but are not limited thereto. The component package 1121 may be in the form of a printed circuit board on which electronic components including active components and/or passive components are surface-mounted. Alternatively, the component package 1121 may be in the form of a printed circuit board in which active components and/or passive components are embedded. Meanwhile, the electronic device is not necessarily limited to the smartphone 1100, but may be any other electronic device as described above.

Printed Circuit Board

Figure 3:
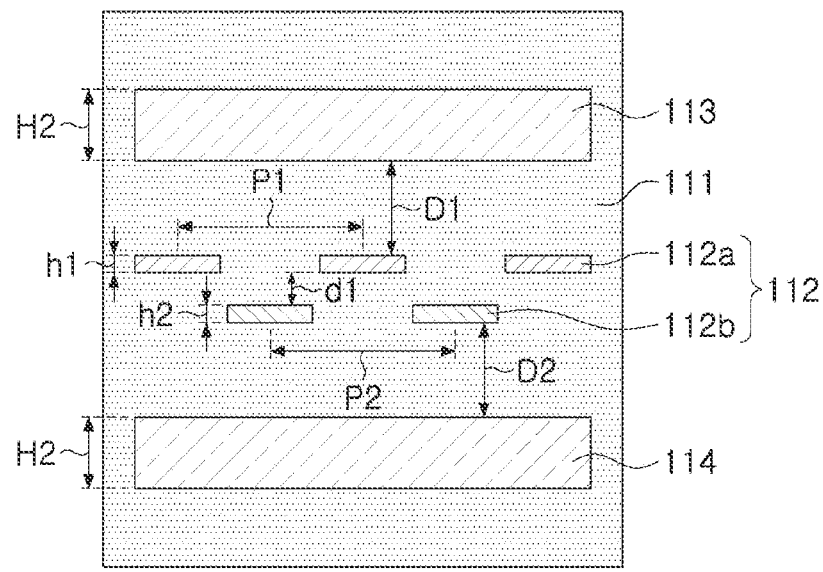
FIG. 3 is a schematic cross-sectional view illustrating an example of a printed circuit board.

FIG. 3 is a schematic cross-sectional view illustrating an example of a printed circuit board.

Figure 4:
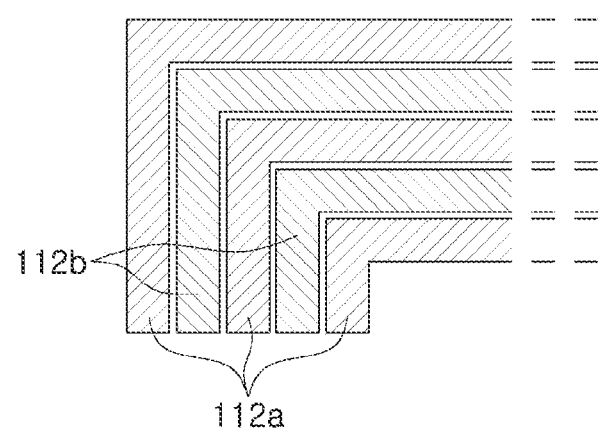
FIG. 4 is a schematic plan view to show only a first wiring layer of the printed circuit board of FIG. 3.

FIG. 4 is a schematic plan view to show only a first wiring layer of the printed circuit board of FIG. 3.

Referring to FIGS. 3 and 4, a printed circuit board 100A according to an exemplary embodiment may include: an insulating member 111; a first wiring layer 112 disposed in the insulating member 111, and including first and second pattern layers 112a and 112b spaced apart from each other based on a thickness direction; and a second wiring layer 113 disposed in the insulating member 111, and spaced apart from the first pattern layer 112a over the first pattern layer 112a based on the thickness direction. If necessary, the printed circuit board 100A according to an exemplary embodiment may further include a third wiring layer 114 disposed in the insulating member 111, and spaced apart from the second pattern layer 112b over the second pattern layer 112b based on the thickness direction.

In this case, based on the thickness direction, an insulation distance d1 between the first pattern layer 112a and the second pattern layer 112b may be smaller than an insulation distance D1 between the first pattern layer 112a and the second wiring layer 113. In addition, each of the first and second pattern layers 112a and 112b may be thinner than the second wiring layer 113. Similarly, based on the thickness direction, the insulation distance d1 between the first pattern layer 112a and the second pattern layer 112b may be smaller than an insulation distance D2 between the second pattern layer 112b and the third wiring layer 114. Also, each of the first and second pattern layers 112a and 112b may be thinner than the third wiring layer 114. Here, the thickness direction may refer to a vertical direction as an upward direction and/or a downward direction in FIG. 3. Meanwhile, the insulation distances and the thicknesses may be measured using a scanning microscope or the like, and each of the insulation distances and the thicknesses may refer to an approximate average value. For example, each of the insulation distances and the thicknesses may be an average value of a largest value and a smallest value.

In addition, a pitch P1 between patterns of the first pattern layer 112a may be larger than a thickness h1 of each of the patterns of the first pattern layer 112a, and a pitch P2 between patterns of the second pattern layer 112b may be larger than a thickness h2 of each of the patterns of the second pattern layer 112b. For example, $P1/2 > h1 > P1/8$ may be satisfied, and $P2/2 > h2 > P2/8$ may be satisfied. As a non-limiting example, P1/4 and P2/4 may be substantially the same as h1 and h2, respectively, with a numerical difference within about ±3 μm. Here, the pitch may refer to a distance between respective center lines of objects. Meanwhile, the pitches and the thicknesses may be measured using a scanning microscope or the like, and each of the pitches and the thicknesses may refer to an approximate average value. For example, each of the pitches and the thicknesses may be an average value of a largest value and a smallest value.

In addition, the pitch P1 between the patterns of the first pattern layer 112a and the pitch P2 between the patterns of the second pattern layer 112b may be larger than the insulation distance d1 between the first pattern layer 112a and the second pattern layer 112b based on the thickness direction. For example, P1/2>d1>P1/8 may be satisfied, and P2/2>d1>P2/8 may be satisfied. As a non-limiting example, when the first wiring layer 112 is divided into two layers as illustrated in FIGS. 3 and 4, P1/4 and P2/4 may be substantially the same as d1 a numerical difference within about ±3 μm, and when the first wiring layer 112 is divided into three layers unlike what is illustrated in FIGS. 3 and 4, P1/6 and P2/6 may be substantially the same as d1 with a numerical difference within about ±3 μm. Here, the thickness direction may refer to a vertical direction as an upward direction and/or a downward direction in FIG. 3. In addition, the pitch may refer to a distance between respective center lines of objects. Meanwhile, the pitches and the insulation distances may be measured using a scanning microscope or the like, and each of the pitches and the insulation distances may refer to an approximate average value. For example, each of the pitches and the insulation distances may be an average value of a largest value and a smallest value.

In addition, in the cross-sectional view, the thickness of the pattern may be smaller than a line width of the pattern in each of the first and second pattern layers 112a and 112b. For example, each of the first and second pattern layers 112a and 112b may have an aspect ratio of less than 1. Here, the cross-sectional view may be a cross-sectional shape of an object when cut vertically or a cross-sectional shape of an object when viewed in a side view. In addition, the thicknesses and the line widths may be measured using a scanning microscope or the like, and each of the thicknesses and the line widths may refer to an approximate average value. For example, each of the thicknesses and the line widths may be an average value of a largest value and a smallest value.

In this way, in the printed circuit board 100A according to an exemplary embodiment, since the first wiring layer 112 is multi-layered as the first and second pattern layers 112a and 112b instead of directly implementing a fine circuit, it is possible to increase the pitches P1 and P2 in the respective layers, and as a result, it is possible to increase circuit density while lowering a level of process difficulty by enabling large-area exposure and the like. In addition, the thicknesses h1 and h2 of the first and second pattern layers 112a and 112b and the insulation distance d1 therebetween can be minimized, and as a result, an overall thickness thereof can be approximately equivalent to a thickness of the first wiring layer 112 before being divided.

Meanwhile, in the plan view, the first and second pattern layers 112a and 112b may be disposed not to overlap each other, or disposed alternately to minimally overlap each other even if they overlap each other. For example, in the plan view, at least a portion of the second pattern layer 112b may be disposed in a region between the patterns of the first pattern layer 112a not to overlap the first pattern layer 112a. In this case, in the plan view, an area of a region of the second pattern layer 112b that does not overlap the first pattern layer 112a may be larger than an area of a region of the second pattern layer 112b that overlaps the first pattern layer 112a. In this point of view, after the line width in each of the first and second pattern layers 112a and 112b is reduced to ½, the patterns of the first pattern layer 112a may not overlap each other, or may alternate each other if they overlap each other. However, via pads may overlap each other. Here, the plan view may refer to a planar shape of an object when cut horizontally, or a planar shape of an object when viewed in a top view or a bottom view.

In this way, in the printed circuit board 100A according to an exemplary embodiment, since the first and second pattern layers 112a and 112b are disposed alternately to hardly overlap each other in the plan view, a separate layer for removing noise is not required therebetween, and thus, an increase in the number of layers can be minimized.

Hereinafter, the components of the printed circuit board 100A according to an exemplary embodiment will be described in more detail with reference to FIGS. 3 and 4.

The insulating member 111 may include an insulating material. The insulating material may include a thermosetting resin such as an epoxy resin, a thermoplastic resin such as a polyimide resin, or a material including an inorganic filler, an organic filler, and/or a glass fiber (glass cloth and/or glass fabric) together with the thermosetting or thermoplastic resin. For example, the insulating material may include, but is not limited to, Ajinomoto build-up film (ABF), prepreg (PPG), or the like. Alternatively, another type of polymer material is applicable as an insulating material. The insulating member 111 may include a plurality of insulating layers, and the plurality of insulating layers may include the same type of insulating material, but are not limited thereto, and may include different insulating materials. A boundary between the plurality of insulating layers may be distinct, or the plurality of insulating layers may be integrated with each other to such an extent that a boundary therebetween is obscure.

Each of the first and second pattern layers 112a and 112b of the first wiring layer 112 may include a metal material. The metal material may include copper (Cu), aluminum (Al), silver (Ag), tin (Sn), gold (Au), nickel (Ni), lead (Pb), titanium (Ti), and/or an alloy thereof. The first and second pattern layers 112a and 112b may perform various functions depending on how the respective layers are designed. For example, the first and second pattern layers 112a and 112b may include ground patterns, power patterns, signal patterns, and the like. Here, the signal patterns may include various signals, e.g., data signals, other than ground patterns, power patterns, and the like. Each of these patterns may include a line pattern, a plane pattern, and/or a pad pattern. Each of the first and second pattern layers 112a and 112b may include an electroless plating layer (or chemical copper) and an electrolytic plating layer (or electrical copper). If necessary, the first wiring layer 112 may include a larger number of pattern layers, and in this case as well, what has been described above is substantially identically applicable.

Each of the thicknesses h1 and h2 of the first and second pattern layers 112a and 112b may be about 0.5 μm to 5 μm. When the thickness is smaller than 0.5 μm, a resistance may increase, resulting in a great signal loss. When the thickness is larger than 5 μm, there may be a limit in offsetting an increase in thickness caused by dividing the first wiring layer 121 into a plurality of layers. However, the thicknesses h1 and h2 of the first and second pattern layers 112a and 112b are not limited thereto. The sum of the thickness h1 or h2 of the first pattern layer 112a or the second pattern layer 112b and the insulation distance d1 between the first pattern layer 112a and the second pattern layer 112b, e.g., h1+d1 or h2+d1, may be smaller than an allowable tolerance of each of the insulation distance D1 between the first wiring layer 112 and the second wiring layer 113 and/or the insulation distance D2 between the first wiring layer 112 and the third wiring layer 114. For example, when D1 and/or D2 is about 20 μm, the allowable tolerance may be about ±6 μm. In this case, h1+d1 or h2+d1 may be 6 μm or less, but is not limited thereto.

Each of the second and third wiring layers 113 and 114 may include a metal material. The metal material may include copper (Cu), aluminum (Al), silver (Ag), tin (Sn), gold (Au), nickel (Ni), lead (Pb), titanium (Ti), and/or an alloy thereof. The second and third wiring layers 113 and 114 may perform various functions depending on how the respective layers are designed. For example, the second and third wiring layers 113 and 114 may include ground patterns, power patterns, signal patterns, and the like. Here, the signal patterns may include various signals, e.g., data signals, other than ground patterns, power patterns, and the like. Each of these patterns may include a line pattern, a plane pattern, and/or a pad pattern. Each of the second and third wiring layers 113 and 114 may include an electroless plating layer (or chemical copper) and an electrolytic plating layer (or electrical copper).

As a non-limiting example, each of the first and second pattern layers 112a and 112b of the first wiring layer 112 may be a signal pattern layer including signal patterns, and each of the second and third wiring layers 113 and 114 may include a ground pattern layer including ground patterns.

Figure 5:
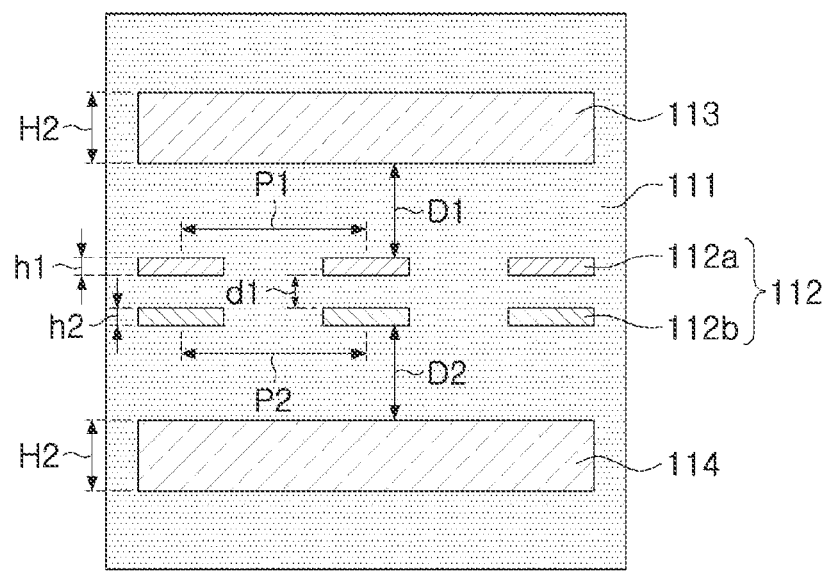
FIG. 5 is a schematic cross-sectional view illustrating another example of a printed circuit board.

FIG. 5 is a schematic cross-sectional view illustrating another example of a printed circuit board.

Figure 6:
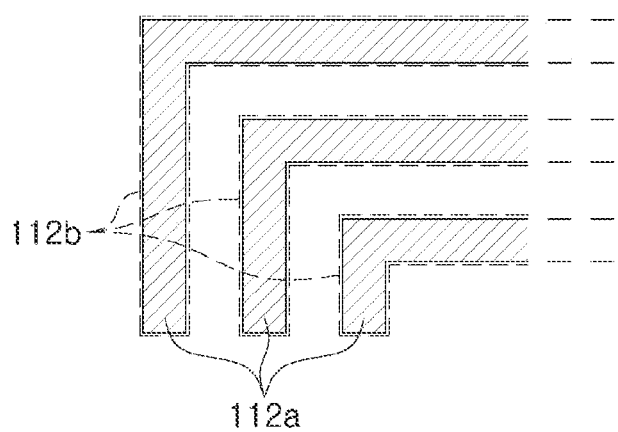
FIG. 6 is a schematic plan view to show only a first wiring layer of the printed circuit board of FIG. 5.

FIG. 6 is a schematic plan view to show only a first wiring layer of the printed circuit board of FIG. 5.

Referring to FIGS. 5 and 6, in a printed circuit board 100B according to another exemplary embodiment, first and second pattern layers 112a and 112b may be disposed to maximally overlap each other in the plan view. For example, in the plan view, at least a portion of the second pattern layer 112b may be disposed over the first pattern layer 112a to overlap the first pattern layer 112a. In this case, in the plan view, an area of a region that overlaps the first pattern layer 112a of the second pattern layer 112b may be larger than an area of a region that does not overlap the first pattern layer 112a of the second pattern layer 112b. Here, the plan view may refer to a planar shape of an object when cut horizontally, or a planar shape of an object when viewed in a top view or a bottom view. In this way, in a case where noise cancellation is possible, the first and second pattern layers 112a and 112b may be disposed side by side.

The other details, for example, the details described above for the printed circuit board 100A according to an exemplary embodiment, may also be applicable to the printed circuit board 100B according to another exemplary embodiment unless contradictory, and the overlapping description will not be repeated.

Figure 7:
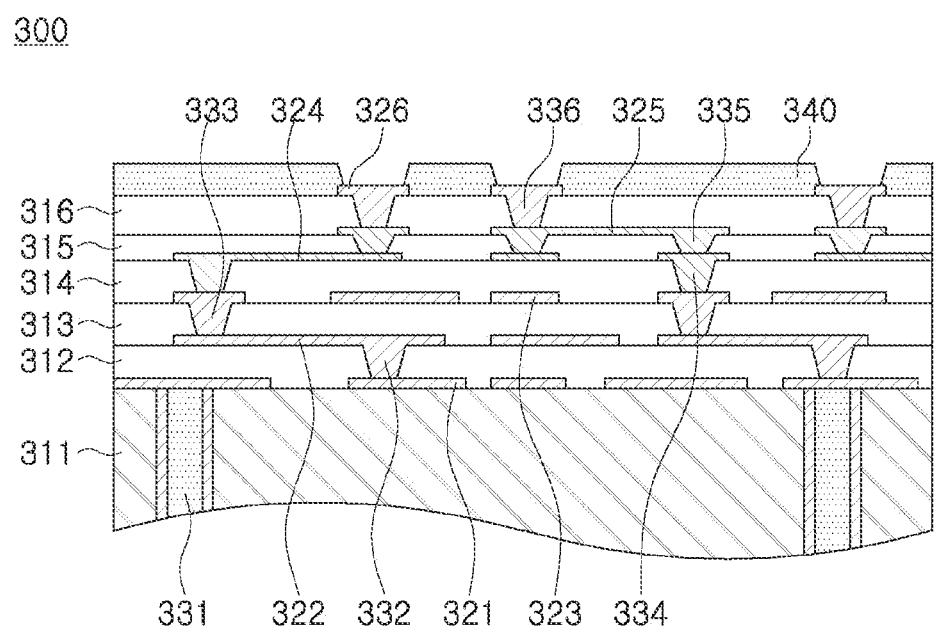
FIG. 7 is a schematic cross-sectional view illustrating another example of a printed circuit board.

FIG. 7 is a schematic cross-sectional view illustrating another example of a printed circuit board.

Referring to FIG. 7, a printed circuit board 300 according to another exemplary embodiment may be a core type multilayer printed circuit board. The printed circuit board 300 according to another exemplary embodiment may include: a first insulating layer 311; a first wiring layer 321 disposed on the first insulating layer 311; a first via layer 331 penetrating through the first insulating layer 311 and connected to the first wiring layer 321; a second insulating layer 312 disposed on the first insulating layer 311 and covering the first wiring layer 321; a second wiring layer 322 disposed on the second insulating layer 312; a second via layer 332 penetrating through the second insulating layer 312 and connecting the first and second wiring layers 321 and 322 to each other; a third insulating layer 313 disposed on the second insulating layer 312 and covering the second wiring layer 322; a third wiring layer 323 disposed on the third insulating layer 313; a third via layer 333 penetrating through the third insulating layer 313 and connecting the second and third wiring layers 322 and 323 to each other; a fourth insulating layer 314 disposed on the third insulating layer 313 and covering the third wiring layer 323; a fourth wiring layer 324 disposed on the fourth insulating layer 314; a fourth via layer 334 penetrating through the fourth insulating layer 314 and connecting the third and fourth wiring layers 323 and 324 to each other; a fifth insulating layer 315 disposed on the fourth insulating layer 314 and covering the fourth wiring layer 324; a fifth wiring layer 325 disposed on the fifth insulating layer 315; a fifth via layer 335 penetrating through the fifth insulating layer 315 and connecting the fourth and fifth wiring layers 324 and 325 to each other; a sixth insulating layer 316 disposed on the fifth insulating layer 315 and covering the fifth wiring layer 325; a sixth wiring layer 326 disposed on the sixth insulating layer 316; a sixth via layer 336 penetrating through the sixth insulating layer 316 and connecting the fifth and sixth wiring layers 325 and 326 to each other; and/or a passivation layer 340 disposed on the sixth insulating layer 316, covering the sixth wiring layer 326, and having a plurality of openings for at least partially exposing the sixth wiring layer 326. The first insulating layer 311 may be a core layer, and the second to sixth insulating layers 312 to 316 may be build-up layers. Similarly, build-up layers, wiring layers, and via layers may be formed on a lower side of the first insulating layer 311 as well. However, the printed circuit board 300 according to another exemplary embodiment is not limited thereto, and if necessary, may be a coreless type multilayer printed circuit board in which a core layer is omitted.

In this case, the fourth wiring layer 324 and the fifth wiring layer 325 may be formed by dividing one wiring layer into multiple layers. Thus, the details described above for the first to third wiring layers 112 to 114 and the first and second pattern layers 112a and 112b in the printed circuit boards 100A and 100B are substantially identically applicable to the printed circuit board 300 according to another exemplary embodiment. For example, each of the fourth and fifth wiring layers 324 and 325 may be thinner than at least one of the first to third wiring layers 321 to 323 and the sixth wiring layer 326. In addition, based on the thickness direction, an insulation distance between the fourth and fifth wiring layers 324 and 325 may be smaller than at least one of an insulation distance between the first and second wiring layers 321 and 322, an insulation distance between the second and third wiring layers 322 and 323, an insulation distance between the third and fourth wiring layers 323 and 324, and an insulation distance between the fifth and sixth wiring layers 325 and 326. Also, a pitch between wirings in each of the fourth and fifth wiring layers 324 and 325 may be larger than a thickness of each of the wirings in each of the fourth and fifth wiring layers 324 and 325. In addition, the pitch between the wirings in each of the fourth and fifth wiring layers 324 and 325 may be larger than the insulation distance between the fourth and fifth wiring layers 324 and 325 based on the thickness direction. Here, the thickness direction may refer to a vertical direction as an upward direction and/or a downward direction in FIG. 7. Meanwhile, the insulation distances, the thicknesses, and the pitches may be measured using a scanning microscope or the like, and each of the insulation distances, the thicknesses, and the pitches may refer to an approximate average value.

For example, each of the insulation distances, the thicknesses, and the pitches may be an average value of a largest value and a smallest value.

Hereinafter, the components of the printed circuit board 300 according to another exemplary embodiment will be described in more detail with reference to FIG. 7.

The first insulating layer 311 may be a core layer. The first insulating layer 311 may include an insulating material. The insulating material may include a thermosetting resin such as an epoxy resin, a thermoplastic resin such as a polyimide resin, or a material including an inorganic filler, an organic filler, and/or a glass fiber together with the thermosetting or thermoplastic resin. For example, the insulating material may include, but is not limited to, PPG or the like, which may be introduced using a copper clad laminate (CCL).

Alternatively, another type of polymer material is applicable as an insulating material.

The second to sixth insulating layers 312 to 316 may be build-up layers. Each of the second to sixth insulating layers 312 to 316 may include an insulating material. The insulating material may include a thermosetting resin such as an epoxy resin, a thermoplastic resin such as a polyimide resin, or a material including an inorganic filler, an organic filler, and/or a glass fiber together with the thermosetting or thermoplastic resin. For example, the insulating material may include, but is not limited to, PPG, ABF, or the like, which may be introduced using resin coated copper (RCC). Alternatively, another type of polymer material is applicable as an insulating material.

Each of the first to sixth wiring layers 321 to 326 may include a metal material. The metal material may include copper (Cu), aluminum (Al), silver (Ag), tin (Sn), gold (Au), nickel (Ni), lead (Pb), titanium (Ti), and/or an alloy thereof. The first to sixth wiring layers 321 to 326 may perform various functions depending on how the respective layers are designed. For example, the first to sixth wiring layers 321 to 326 may include ground patterns, power patterns, signal patterns, and the like. Here, the signal patterns may include various signals, e.g., data signals, other than ground patterns, power patterns, and the like. Each of these patterns may include a line pattern, a plane pattern, and/or a pad pattern. Each of the first to sixth wiring layers 321 to 326 may include an electroless plating layer (or chemical copper) and an electrolytic plating layer (or electrical copper).

The first via layer 331 may electrically connect the first wiring layer 321 to an opposite wiring layer, as a result forming an electrical path in the printed circuit board 300. The first via layer 331 may perform various functions depending on design. For example, the first via layer 331 may include a ground through via, a power through via, a signal through via, or the like. The first via layer 331 may include a plurality of through vias. Each of the through vias in the first via layer 331 may include a conductive material, in particular a metal material, such as copper (Cu), aluminum (Al), silver (Ag), tin (Sn), gold (Au), nickel (Ni), lead (Pb), titanium (Ti), or an alloy thereof. Each of the through vias in the first via layer 331 may include an electroless plating layer (or chemical copper) and an electrolytic plating layer (or electrical copper). The first via layer 331 may include a plated through hole (PTH), and the PTH may be filled with a plug material if necessary.

The second to sixth via layers 332 to 336 may electrically connect the first to sixth wiring layers 321 to 326 formed on different layers, as a result forming an electrical path in the printed circuit board 300. The second to sixth via layers 332 to 336 may perform various functions depending on how the respective layers are designed. For example, each of the second to sixth via layers 332 to 336 may include a ground connection via, a power connection via, a signal connection via, or the like. Each of the second to sixth via layers 332 to 336 may include a plurality of connection vias. Each of the connection vias in the second to sixth via layers 332 to 336 may include a conductive material, in particular a metal material, such as copper (Cu), aluminum (Al), silver (Ag), tin (Sn), gold (Au), nickel (Ni), lead (Pb), titanium (Ti), or an alloy thereof. Each of the connection vias in the second to sixth via layers 332 to 336 may include an electroless plating layer (or chemical copper) and an electrolytic plating layer (or electrical copper). Each of the connection vias in the second to sixth via layers 332 to 336 may be of a type in which a via hole is filled with the conductive material, or may be of a conformal type in which the conductive material is disposed along a wall surface of a via hole. Each of the connection vias in the second to sixth via layers 332 to 336 may have a tapered shape.

The passivation layer 340 may be disposed on an outermost side of the printed circuit board 300 to protect components inside the printed circuit board 300. A material of the passivation layer 340 is not particularly limited. For example, the passivation layer 340 may be formed using an insulating layer. In this case, the insulating layer may be solder resist. However, the passivation layer 340 is not limited thereto, and may be formed using ABF or the like.

The other details, for example, the details described above for the printed circuit board 100A according to an exemplary embodiment and the printed circuit board 100B according to another exemplary embodiment, may also be applicable to the printed circuit board 300 according to another exemplary embodiment unless contradictory, and the overlapping description will not be repeated.

As set forth above, as one effect of the present disclosure, it is possible to provide a printed circuit board capable of realizing circuit density equivalent to that of a fine circuit.

As another effect of the present disclosure, it is possible to provide a printed circuit board capable of large-area exposure.

While exemplary embodiments have been shown and described above, it will be apparent to those skilled in the art that modifications and variations could be made without departing from the scope of the present invention as defined by the appended claims.

What is claimed is:

1. A printed circuit board comprising:
   an insulating member;
   a first wiring layer disposed in the insulating member, and including a first pattern layer and a second pattern layer spaced apart from each other based on a thickness direction of the printed circuit board;
   a second wiring layer disposed in the insulating member, and spaced apart from the first pattern layer over the first pattern layer based on the thickness direction; and
   a third wiring layer disposed in the insulating member, and spaced apart from the second pattern layer over the second pattern layer based on the thickness direction,
   wherein, based on the thickness direction, an insulation distance between the first pattern layer and the second pattern layer is smaller than an insulation distance between the first pattern layer and the second wiring layer and an insulation distance between the second pattern layer and the third wiring layer, and
   each of the first and second pattern layers is thinner than the second wiring layer and the third wiring layer.

2. The printed circuit board of claim 1, wherein each of the first and second pattern layers includes a signal pattern layer, and
    each of the second and third wiring layers includes a ground pattern layer.

3. The printed circuit board of claim 1, wherein a pitch between patterns in each of the first and second pattern layers is larger than a thickness of the patterns in each of the first and second pattern layers.

4. The printed circuit board of claim 3, wherein P1/2>h1>P1/8, and P2/2>h2>P2/8, where P1 is the pitch between patterns in the first pattern layer, P2 is the pitch between patterns in the second pattern layer, h1 is the thickness of the patterns in the first pattern layer, and h2 is the thickness of the patterns in the second pattern layer.

5. The printed circuit board of claim 1, wherein a pitch between patterns in each of the first and second pattern layers is larger than the insulation distance between the first and second pattern layers based on the thickness direction.

6. The printed circuit board of claim 5, wherein P1/2>d1>P1/8, and P2/2>d1>P2/8, where P1 is the pitch between patterns in the first pattern layer, P2 is the pitch between patterns in the second pattern layer, and d1 is the insulation distance between the first and second pattern layers based on the thickness direction.

7. The printed circuit board of claim 1, wherein, in a plan view, at least a portion of the second pattern layer is disposed in a region between patterns of the first pattern layer not to overlap the first pattern layer.

8. The printed circuit board of claim 7, wherein, in the plan view, an area of a region of the second pattern layer that does not overlap the first pattern layer is larger than an area of a region of the second pattern layer that overlaps the first pattern layer.

9. The printed circuit board of claim 1, wherein, in a plan view, at least a portion of the second pattern layer is disposed over the first pattern layer to overlap the first pattern layer.

10. The printed circuit board of claim 9, wherein, in the plan view, an area of a region of the second pattern layer that overlaps the first pattern layer is larger than an area of a region of the second pattern layer that does not overlap the first pattern layer.

11. The printed circuit board of claim 1, wherein, in a cross-sectional view, a thickness of a pattern is smaller than a line width of the pattern in each of the first and second pattern layers.

12. A printed circuit board comprising:
    an insulating member;
    an upper wiring layer and a lower wiring layer disposed in the insulating member; and
    a first pattern layer and a second pattern layer spaced apart from each other based on a thickness direction of the printed circuit board, the first pattern layer disposed between the upper wiring layer and the second pattern layer, and the second pattern layer disposed between the lower wiring layer and the first pattern layer,
    wherein, based on the thickness direction, an insulation distance between the first pattern layer and the second pattern layer is smaller than an insulation distance between the first pattern layer and the upper wiring layer and an insulation distance between the second pattern layer and the lower wiring layer, and
    in a plan view, patterns of the first pattern layer and patterns of the second pattern layer are alternately disposed.

13. The printed circuit board of claim 12, wherein, in the plan view, an area of a region of the second pattern layer that does not overlap the first pattern layer is larger than an area of a region of the second pattern layer that overlaps the first pattern layer.

14. The printed circuit board of claim 12, wherein a pitch between the patterns in each of the first and second pattern layers is larger than the insulation distance between the first and second pattern layers based on the thickness direction.

15. The printed circuit board of claim 12, wherein each of the first and second pattern layers includes a signal pattern layer, and
    each of the upper and lower wiring layers includes a ground pattern layer.

* * * * *